US012721088B2

(12) United States Patent
Lee et al.

(10) Patent No.: US 12,721,088 B2
(45) Date of Patent: Aug. 25, 2026

(54) SEMICONDUCTOR HIGH PRESSURE ANNEALING DEVICE

(71) Applicant: Tokyo Electron Limited, Tokyo (JP)

(72) Inventors: Cheng-Hsiung Lee, Kaohsiung (TW); Chun-Hung Hung, Kaohsiung (TW); Chun-Hung Hung, Kaohsiung (TW); Fu-Chieh Hsu, Kaohsiung (TW)

(73) Assignee: Tokyo Electron Limited, Tokyo (JP)

( * ) Notice: Subject to any disclaimer, the term of this patent is extended or adjusted under 35 U.S.C. 154(b) by 392 days.

(21) Appl. No.: 18/409,764

(22) Filed: Jan. 10, 2024

(65) Prior Publication Data

US 2024/0242982 A1 Jul. 18, 2024

(30) Foreign Application Priority Data

Jan. 18, 2023 (TW) ................................ 112102353

(51) Int. Cl.

| | |
|---|---|
| ***H10P 72/00*** | (2026.01) |
| ***F27B 17/00*** | (2006.01) |
| ***F27D 1/18*** | (2006.01) |
| ***F27D 7/02*** | (2006.01) |
| ***F27D 9/00*** | (2006.01) |
| *F27D 7/06* | (2006.01) |

(52) U.S. Cl.
CPC ...... *H10P 72/0434* (2026.01); *F27B 17/0025* (2013.01); *F27D 1/18* (2013.01); *F27D 7/02* (2013.01); *F27D 9/00* (2013.01); *H10P 72/0402* (2026.01); *F27D 2007/063* (2013.01); *F27D 2009/0002* (2013.01)

(58) Field of Classification Search
CPC ............. H10P 72/0402; H10P 72/0434; H10P 72/0441; F27D 1/18; F27D 7/02; F27D 9/00; F27D 2007/063; F27D 2009/0002; F27B 17/0025
See application file for complete search history.

(56) References Cited

U.S. PATENT DOCUMENTS

| | | | | |
|---|---|---|---|---|
| 5,302,120 A * | 4/1994 | Durado | H10P 72/0441 | 432/247 |
| 2004/0175666 A1 * | 9/2004 | Saito | H10P 72/0434 | 432/72 |
| 2023/0037848 A1 * | 2/2023 | Taguchi | H02K 5/12 | |

* cited by examiner

*Primary Examiner* — Steven S Anderson, II
(74) *Attorney, Agent, or Firm* — IPUSA, PLLC

(57) ABSTRACT

A semiconductor high pressure annealing device is described. The semiconductor high pressure annealing device includes a chamber body, a cover, a lifting mechanism, and a floating sealing structure. Air tightness between the chamber body and the cover is achieved by the floating sealing structure. A first sealing ring and a second sealing ring of the floating sealing structure are arranged on the top and the bottom for reducing the damage to the first sealing ring and the second sealing ring when the cover moves up and down. A preload spring assembly of the floating sealing structure can provide tension to assist in improving the air tightness between the chamber body and the cover.

15 Claims, 5 Drawing Sheets

SEMICONDUCTOR HIGH PRESSURE ANNEALING DEVICE

RELATED APPLICATIONS

This application claims priority to Taiwan application Ser. No. 11/210,2353, filed Jan. 18, 2023, which is herein incorporated by reference.

BACKGROUND

Field of Invention

The present disclosure relates to a high pressure annealing device, and more particularly, to a semiconductor high pressure annealing device.

Description of Related Art

During or after oxidation, nitridation, ion implantation and chemical evaporation processes of a semiconductor, a heat treatment is performed on the semiconductor. In the heat treatment process, the temperature or time of the heat treatment can be reduced to enhance performance by increasing the pressure.

The existing high-pressure annealing device includes a sealing ring disposed between the chamber body and the cover. The air tight effect is achieved through the sealing ring. However, when the cover is opened, the cover moves axially relative to the chamber body. The sealing ring is rubbed by the chamber body, such that the sealing ring is easily damaged, and the service life of the sealing ring is decreased.

In order to solve the problem that the sealing ring is easily damaged, a floating sealing device and a pressurizer are used. The sealing degree of the floating sealing device depends on the pressurization degree of the pressurizer. However, the leakage of the pipeline easy occurs, resulting in insufficient pressurization pressure.

SUMMARY

Therefore, one objective of the present disclosure is to provide a semiconductor high pressure annealing device to solve the problems that the sealing ring is easily damaged and the sealing effect is affected by the leakage of the pipeline.

According to the aforementioned objective, the present disclosure provides a semiconductor high pressure annealing device, which includes a chamber body, a cover, a lifting mechanism, and a floating sealing structure. The chamber body includes a lower opening and an assembly groove. The assembly groove is located on an inner side surface of the chamber body, and includes an inner top surface. The inner top surface faces the lower opening. The cover is configured to close the lower opening. The lifting mechanism is configured to drive the cover to move axially. The floating sealing structure is disposed on the chamber body and is located in the assembly groove, and is configured to seal the cover and the chamber body and to enhance air tightness between the chamber body and the cover. The floating sealing structure includes a body, fixing members, a first sealing ring, a second sealing ring, and a preload spring assembly. The body is located in the assembly groove. The fixing members are disposed in the chamber body and are connected to the body, and are configured to dispose the body on the chamber body in a floating manner. The first sealing ring is located on an upper portion of the body and is not exposed on an inner side surface of the body, and the first sealing ring abuts against the inner top surface to enhance the air tightness between the body and the chamber body. The second sealing ring is located on a lower portion of the body and is not exposed on the inner side surface of the body, and the second sealing ring abuts against the body and the cover and is configured to increase air tightness between the body and the cover. The preload spring assembly is disposed on the upper portion of the body and abutting against the inner top surface. The preload spring assembly acts in a longitudinal direction.

According to one embodiment of the present disclosure, the chamber body includes at least one through port and at least one reactive gas injection and discharge port. The through port is configured to inject and/or discharge a protective gas. The reactive gas injection and discharge port is configured to inject and/or discharge a reactive gas.

According to one embodiment of the present disclosure, the floating sealing structure is located between the through port and the reactive gas injection and discharge port.

According to one embodiment of the present disclosure, the chamber body includes at least one through port and at least one reactive gas injection and discharge port. The reactive gas injection and discharge port is configured to inject and/or discharge a reactive gas. The through port is configured to accommodate a detection device. The detection device is configured to detect leaking of the reactive gas and whether external gases flow into the chamber body or not.

According to one embodiment of the present disclosure, the chamber body is configured to bear a pressure ranging from 10 bar to 1000 bar.

According to one embodiment of the present disclosure, the chamber body includes fastening recesses. The fastening recesses are located on the inner side surface of the chamber body. The cover includes fastening protrusions and segment driving members. The fastening protrusions are located on a bottom surface of the cover. The segment driving members are respectively connected to the fastening protrusions, and are configured to drive the fastening protrusions to insert into the fastening recesses or disengage from the fastening recesses.

According to one embodiment of the present disclosure, the lifting mechanism comprises a screw and a lifting driving member. The lifting driving member is connected to the screw rod and is configured to drive the screw to rotate so as to drive the cover to move upward and downward.

According to one embodiment of the present disclosure, the body includes a first accommodating groove, a second accommodating groove, and an assembly portion. The first accommodating groove is located on the upper portion of the body and is configured to accommodate the first sealing ring. The second accommodating groove is located on the lower portion of the body and is configured to accommodate the second sealing ring. The assembly portion is located on the upper portion of the body and is configured to accommodate the preload spring assembly.

According to one embodiment of the present disclosure, the second sealing ring includes a fixing protrusion. The fixing protrusion is configured to fix the second sealing ring in the second accommodating groove.

According to one embodiment of the present disclosure, the body includes assembly openings. The assembly openings are located on an outer side surface of the body. The fixing members are inserted into the assembly openings. A diameter of each of the fixing members is smaller than a diameter of a corresponding one of the assembly openings.

According to one embodiment of the present disclosure, a longitudinal cross-sectional shape of the first sealing ring is circular, U-shaped, X-shaped, W-shaped, quadrilateral, or wavy-shaped. A longitudinal cross-sectional shape of the second sealing ring is circular, U-shaped, X-shaped, W-shaped, quadrilateral, or wavy-shaped.

According to one embodiment of the present disclosure, the preload spring assembly includes plural springs.

According to one embodiment of the present disclosure, the semiconductor high pressure annealing device includes a cooling jacket. The cooling jacket is disposed on an outer side surface of the chamber body and is configured to cool the chamber body and the first sealing ring.

According to one embodiment of the present disclosure, the semiconductor high pressure annealing device includes a heater, and the heater is located within the chamber body.

According to the aforementioned description, the semiconductor high pressure annealing device uses the floating sealing structure to achieve air tightness between the chamber body and the cover. When the cover closes the lower opening, the compressed preload spring assembly can provide tension. The first sealing ring and the second sealing ring can more reliably abut against the chamber body and the cover respectively through the tension of the preload spring assembly, thereby enhancing the air tightness between the chamber body and the cover. The first sealing ring and the second sealing ring of the floating sealing structure are arranged on the top and the bottom, and the first sealing ring and the second sealing ring are not exposed on the inner side surface of the body, such that when the cover moves upward and downward, the friction damage to the first sealing ring and the second sealing ring caused by the cover can be reduced, thereby increasing the service life of the first sealing ring and the second sealing ring.

BRIEF DESCRIPTION OF THE DRAWINGS

In order to make the above and other objectives, features, advantages, and embodiments of the present disclosure more obvious and understandable, the accompanying drawings are described as follows.

DETAILED DESCRIPTION

Figure 1:
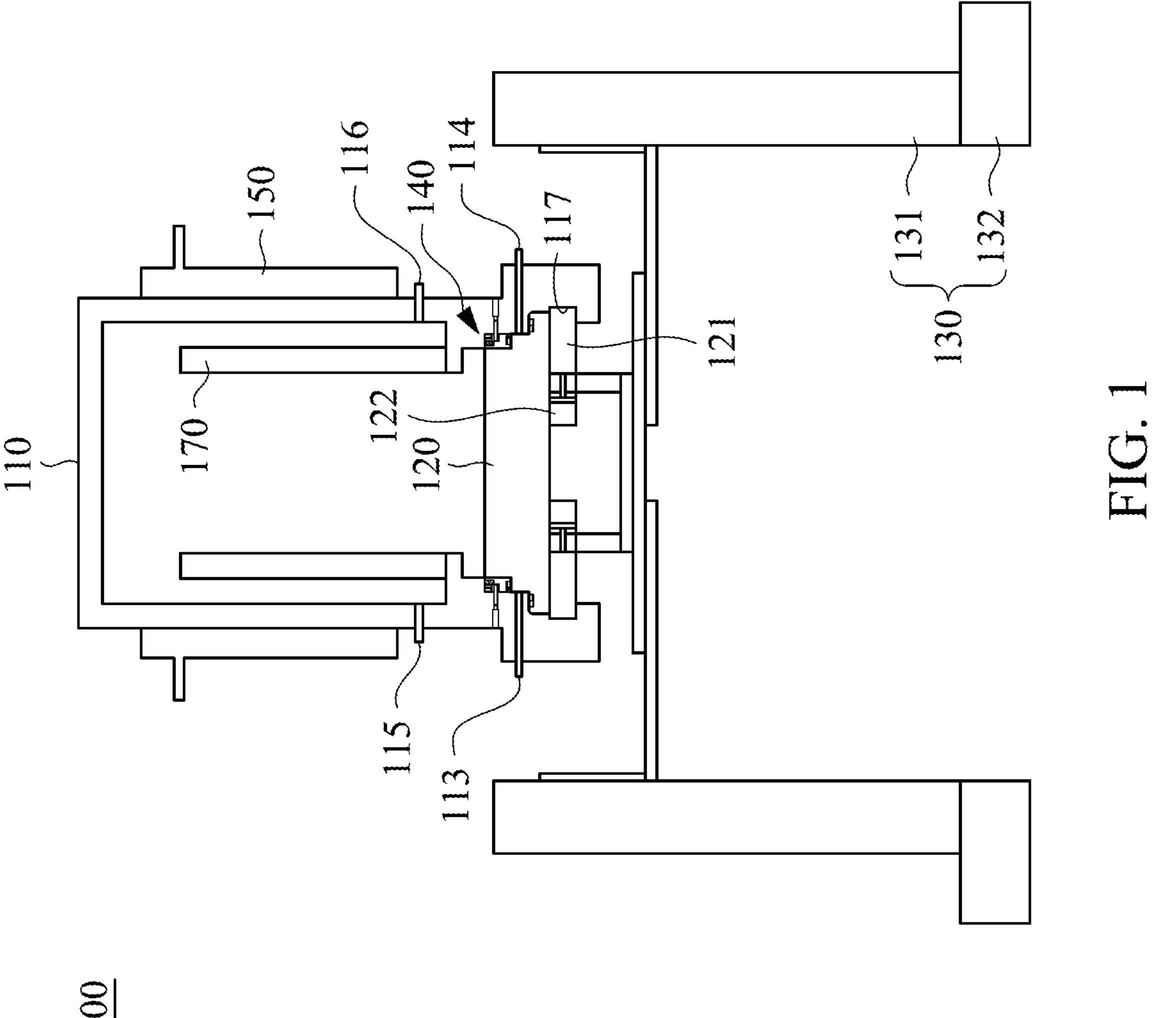
FIG. 1 is a schematic cross-sectional view of a semiconductor high pressure annealing device in accordance with one embodiment of the present disclosure.

Referring to FIG. 1, FIG. 1 is a schematic cross-sectional view of a semiconductor high pressure annealing device 100 in accordance with one embodiment of the present disclosure. The semiconductor high pressure annealing device 100 includes a chamber body 110, a cover 120, a lifting mechanism 130, and a floating sealing structure 140.

Figure 2A:
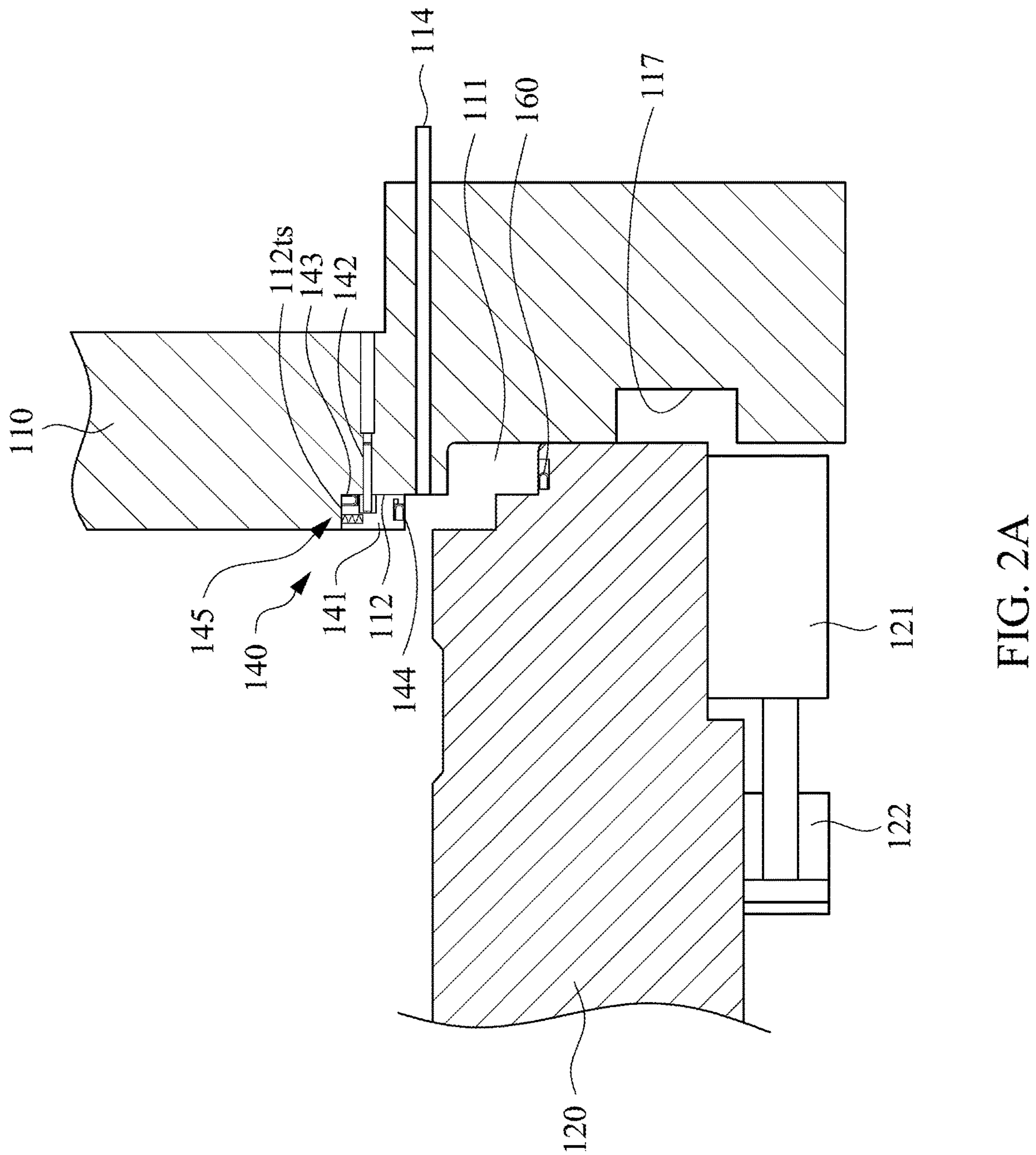
FIG. 2A is an enlarged cross-sectional view of a cover that moves upward in accordance with one embodiment of the present disclosure.

Continuing to refer to FIG. 1, and refer to FIG. 2A together. FIG. 2A is an enlarged cross-sectional view of the cover 120 that moves upward in accordance with one embodiment of the present disclosure. The chamber body 110 includes a lower opening 111 and an assembly groove 112. The lower opening 111 is located on a bottom of the chamber body 110. The assembly groove 112 is located on an inner side surface of the chamber body 110 and includes an inner top surface 112*ts*. The inner top surface 112*ts* faces the lower opening 111. In one example, the chamber body 110 is configured to bear a pressure ranging from 10 bar to 1000 bar.

Continuing to refer to FIG. 1, the chamber body 110 includes through ports 113 and 114 and reactive gas injection and discharge ports 115 and 116. The through port 113 is configured to inject a protective gas. The protective gas may be an inert gas. The through port 114 is configured to discharge the protective gas. The reactive gas injection and discharge port 115 is configured to inject a reactive gas into the chamber body 110. The reactive gas injection and discharge port 116 is configured to discharge the reactive gas in the chamber body 110. The through port 113 is located below the reactive gas injection and discharge port 115. The through port 114 is located below the reactive gas injection and discharge port 116. The injected protective gas is located between the chamber body 110 and the cover 120, and can be used to prevent the reactive gas from leaking to the environment.

In one example, the chamber body 110 may only include the through port 113 and the reactive gas injection and discharge port 115. The through port 113 may be connected to a tee joint, and is configured to inject and discharge the protective gas. The reactive gas injection and discharge port 115 may be connected to a tee joint, and is configured to inject and discharge the reactive gas.

In another example, both the through ports 113 and 114 can be connected to the tee joints, and configured to inject and discharge the protective gas. Both the reactive gas injection and discharge ports 115 and 116 can be connected to tee joints, and configured to inject and discharge the reactive gas.

In one example, the through port 113 and/or the through port 114 can be provided with detection devices. The detection devices are used to detect whether the reactive gas in the chamber body 110 leaks or not, such that the detection is carried out immediately, and the safety is enhanced. That is, the chamber body 110 may only include the through port 113 or 114. The through port 113 or 114 is provided with the detection device to detect the leakage of the reactive gas. Alternatively, the chamber body 110 includes through ports 113 and 114, and both the through ports 113 and 114 are provided with the detection devices to detect the leakage of reactive gases. The detection devices can be further used to detect whether external gases flow into the chamber body 110 or not.

Figure 2B:
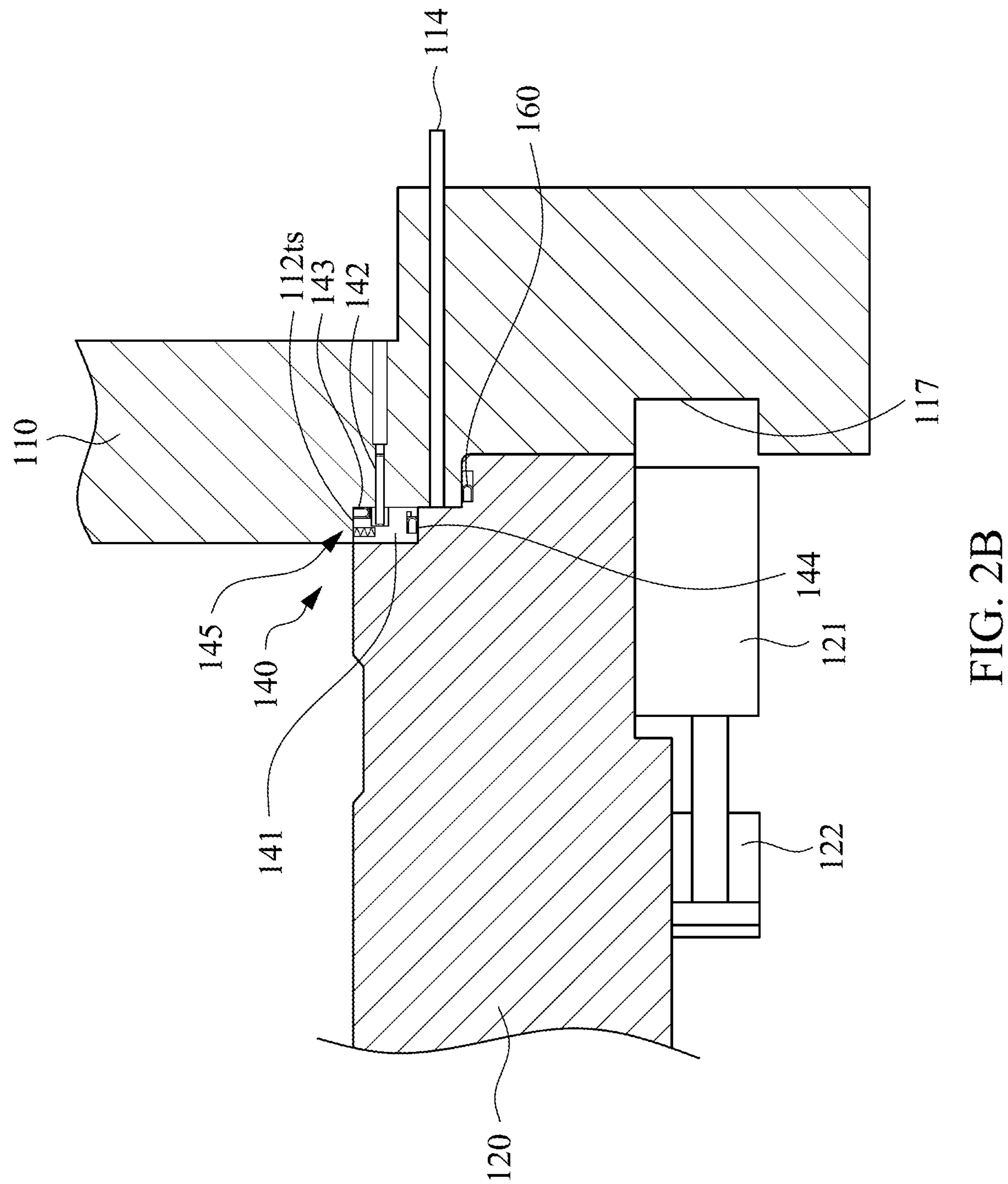
FIG. 2B is an enlarged cross-sectional view of the cover that abuts against a floating sealing structure in accordance with one embodiment of the present disclosure.

Refer to FIG. 1 and FIG. 2B. FIG. 2B is an enlarged cross-sectional view of the cover 120 that abuts against the floating sealing structure 140 in accordance with one embodiment of the present disclosure. The chamber body 110 includes plural fastening recesses 117. The fastening recesses 117 are located on the inner side surface of the chamber body 110. In another example, the fastening recesses 117 may be connected to each other to form a fastening groove. The fastening recesses 117 are located below the through port 113.

Figure 2C:
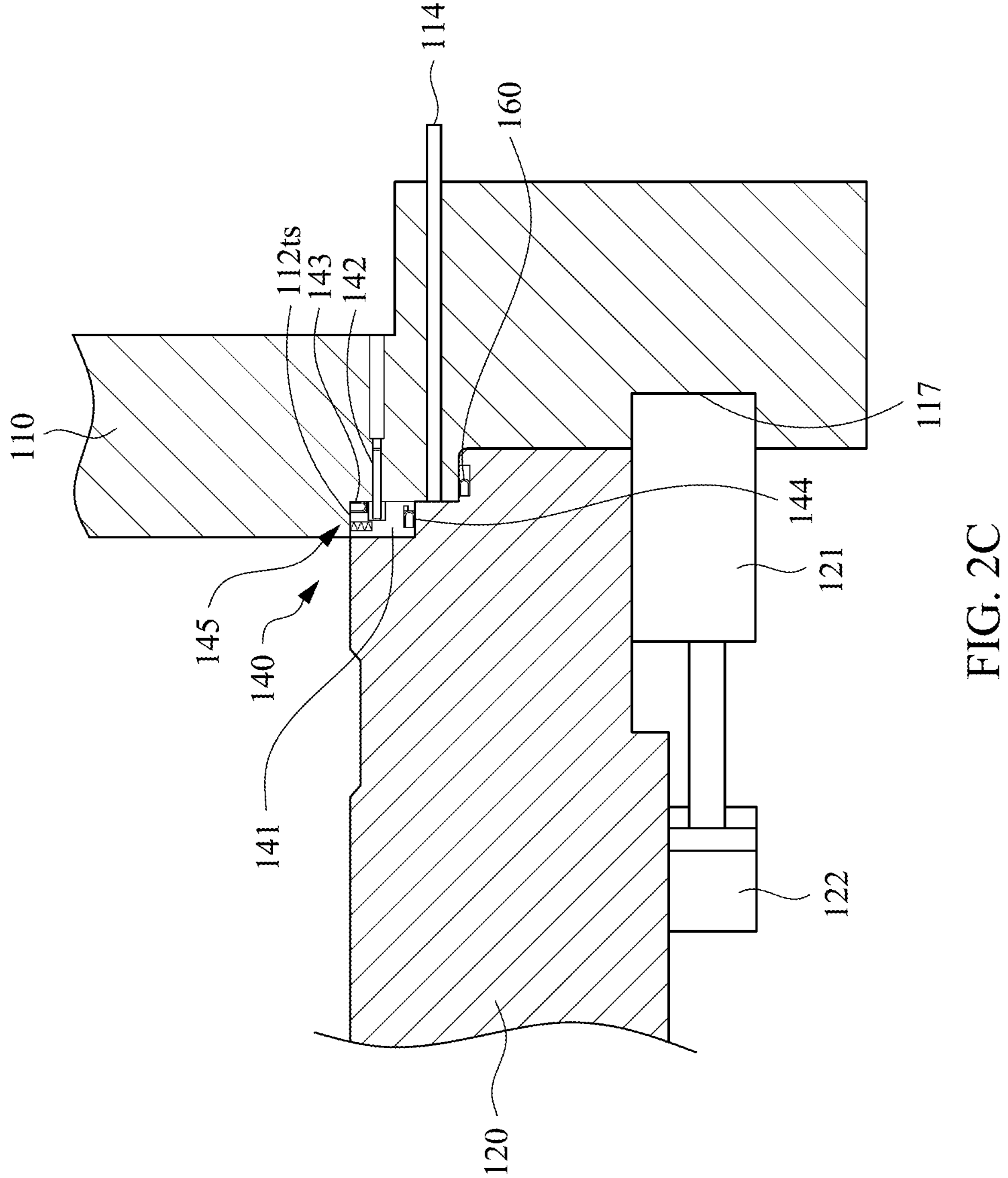
FIG. 2C is an enlarged schematic cross-sectional view of the cover fixed to the chamber body in accordance with one embodiment of the present disclosure.

Then, refer to FIG. 2B and FIG. 2C. FIG. 2C is an enlarged schematic cross-sectional view of the cover 120 fixed to the chamber body 110 in accordance with one embodiment of the present disclosure. The cover 120 is configured to close the lower opening 111. The cover 120 includes plural fastening protrusions 121 and plural segment driving members 122. The fastening protrusions 121 are located on a bottom surface of the cover 120 and can be inserted into the corresponding fastening recesses 117, such that the cover 120 can be fixed to the chamber body 110. The segment driving members 122 are respectively connected to the fastening protrusions 121 and are configured to transversely drive the corresponding fastening protrusions 121 to move laterally. Specifically, the segment driving members 122 can drive the fastening protrusions 121 to move outward. The fastening protrusions 121 are inserted into the corresponding fastening recesses 117, such that the cover 120 is fixed to the chamber body 110. The segment driving members 122 can drive the fastening protrusions 121 to move inward. The fastening protrusions 121 are disengaged from the corresponding fastening recesses 117 to release the state that the cover 120 is fixed to the chamber body 110.

Continuing to refer to FIG. 1 and FIG. 2A, the lifting mechanism 130 is configured to drive the cover 120 to move axially. In other words, the lifting mechanism 130 drives the cover 120 to move up and down, so as to control the opening and closing of the lower opening 111. That is, the lifting mechanism 130 drives the cover 120 to move upward, such that the cover 120 can close the lower opening 111. The lifting mechanism 130 drives the cover 120 to move downward, such that the cover 120 is separated from the chamber body 110 to open the lower opening 111. In one example, the lifting mechanism 130 includes a screw 131 and a lifting driving member 132. The lifting driving member 132 is connected to the screw 131 and is configured to drive the screw 131 to rotate. The cover 120 is driven to move upward and downward by the rotation of the screw 131.

Continuing to refer to FIG. 1, FIG. 2A, and FIG. 2C, the floating sealing structure 140 is disposed on the chamber body 110 and located in the assembly groove 112, and is configured to seal the cover and the chamber body and to enhance the air tightness between the chamber body 110 and the cover 120. The floating sealing structure 140 is located between the through port 113 and the reactive gas injection and discharge port 115, and between the through port 114 and the reactive gas injection and discharge port 116. Next, refer to FIG. 3, which is a partial enlarged schematic diagram of FIG. 2C. The floating sealing structure 140 includes a body 141, fixing members 142, a first sealing ring 143, a second sealing ring 144, and a preload spring assembly 145.

Figure 3:
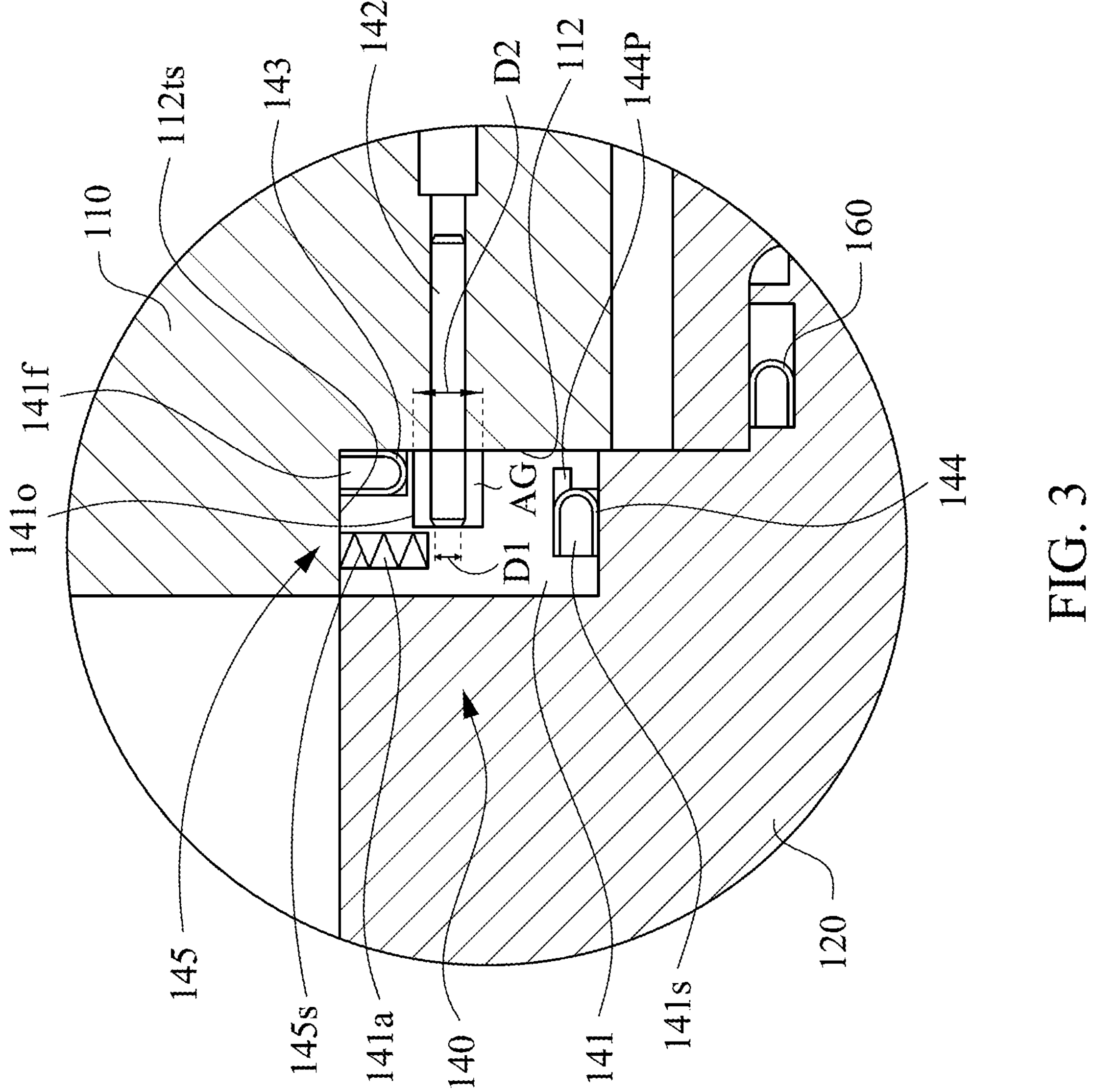
FIG. 3 is a partial enlarged schematic diagram of FIG. 2C.

Continuing to refer to FIG. 3, the body 141 is located in the assembly groove 112. The body 141 may surround the inner side surface of the chamber body 110. The body 141 includes a first accommodating groove 141*f*, a second accommodating groove 141*s*, and an assembly portion 141*a*. The first accommodating groove 141*f* is located on an upper portion of the body 141 and is configured to accommodate the first sealing ring 143. The second accommodating groove 141*s* is located on a lower portion of the body 141 and is configured to accommodate the second sealing ring 144. The assembly portion 141*a* is located on the upper portion of the body 141 and is configured to accommodate the preload spring assembly 145. In one example, the body 141 includes assembly openings 141*o*. The assembly openings 141*o* are located on an outer side surface of the body 141, and the assembly openings 141*o* face an inner side surface of the assembly groove 112. In one example, there may be plural assembly openings 141*o*. In another example, the assembly openings 141*o* are connected to form an elongated assembly slot. The elongated assembly slot surrounds the body 141, such that the operational convenience of inserting the fixing members 142 into the body 141 is enhanced.

Continuing to refer to FIG. 3, the fixing members 142 are disposed in the chamber body 110 and connected to the body 141, and are configured to dispose the body 141 on the chamber body 110 in a floating manner. In one example, two ends of the fixing member 142 are respectively inserted into the chamber body 110 and the assembly opening 141*o* of the body 141. A diameter D1 of the fixing member 142 is smaller than a diameter D2 of the assembly opening 141*o*, such that an activity gap AG is formed between the fixing member 142 and the assembly opening 141*o*. The activity gap AG provides room for the body 141 to move upward and downward.

Continuing to refer to FIG. 3, the first sealing ring 143 is located on the upper portion of the body 141 and is not exposed on an inner side surface of the body 141. The first sealing ring 143 abuts against the inner top surface 112*ts* to enhance the air tightness between the body 141 and the chamber body 110. In one example, a longitudinal cross-sectional shape of the first sealing ring 143 is circular, U-shaped, X-shaped, W-shaped, quadrilateral, or wavy-shaped. In one example, an opening of the first sealing ring 143 faces the inner top surface 112*ts*. In one example, there may be one or plural first sealing rings 143.

Continuing to refer to FIG. 3, the second sealing ring 144 is located on the lower portion of the body 141 and is not exposed on the inner side surface of the body 141. The second sealing ring 144 abuts against the body 141 and the cover 120, and is configured to increase the air tightness between the body 141 and the cover 120. In one example, a longitudinal cross-sectional shape of the second sealing ring 144 is circular, U-shaped, X-shaped, W-shaped, quadrilateral, or wavy-shaped. In one example, an opening of the second sealing ring 144 faces the inner side surface of the body 141. In one example, the second sealing ring 144 includes a fixing protrusion 144P. The fixing protrusion 144P is configured to fix the second sealing ring 144 in the second accommodating groove 141*s*. In one example, there may be one or plural second sealing rings 144.

Continuing to refer to FIG. 3, the preload spring assembly 145 acts in a longitudinal direction, and the preload spring assembly 145 includes plural springs 145*s*. The springs 145*s* are spaced apart from each other. In each of the springs 145*s*, an upper end of the spring 145*s* abuts against the inner top surface 112*ts*, and a lower end of the spring 145*s* abuts against the inner bottom surface of the assembly portion 141*a*. When the cover 120 moves upward, the cover 120 pushes against the floating sealing structure 140. The preload spring assembly 145 of the floating sealing structure 140 is compressed to provide tension. The first sealing ring 143 is subjected to the tension of the preload spring assembly 145, such that the first sealing ring 143 can more reliably abut against the chamber body 110 to increase the air tightness between the chamber body 110 and the body 141, and to prevent the reactive gas in the chamber body 110 from leaking through the gap between the body 141 and the chamber body 110. The second sealing ring 144 is subjected to the tension of the preload spring assembly 145, such that the second sealing ring 144 can more reliably abut against the cover 120 to increase the air tightness between the cover 120 and the body 141, and to prevent the reactive gas in the chamber body 110 from leaking through the gap between the cover 120 and the body 141.

Then, referring to FIG. 2A to FIG. 2C, when the cover 120 moves upward and downward, the cover 120 will rub against the inner side surface of the body 141. The first sealing ring 143 and the second sealing ring 144 of the floating sealing structure 140 are arranged on the top and the bottom, and the first sealing ring 143 and the second sealing ring 144 are not exposed on the inner side surface of the body 141, such that the damage to the first sealing ring 143 and the second sealing ring 144 caused by the rubbing of the cover 120 can be reduced, thereby increasing the service life of the first sealing ring 143 and the second sealing ring 144.

Then, referring to FIG. 1 and FIG. 2A, the semiconductor high pressure annealing device 100 includes a cooling jacket 150. The cooling jacket 150 is disposed on an outer side surface of the chamber body 110. The cooling jacket 150 is configured to cool the chamber body 110, the first sealing ring 143, and an air tight ring 160 located between the chamber body 110 and the cover 120 to keep the first sealing ring 143 and the air tight ring 160 being at an effective working temperature to prevent failure of the first sealing ring 143 and the air tight ring 160.

Continuing to refer to FIG. 1, the semiconductor high pressure annealing device 100 includes a heater 170. The heater 170 is located within the chamber body 110. The heater 170 is configured to increase the temperature inside the chamber body 110 to a temperature required by the annealing process.

According to the aforementioned embodiments, one advantage of the present disclosure is that the floating sealing structure of the present disclosure reduces the friction damage to the first sealing ring and the second sealing ring caused by the cover, thereby increasing the service life of the first sealing ring and the second sealing ring. In addition, the preload spring assembly of the floating sealing structure provides tension to enhance the air tightness. The floating sealing structure does not need a pressurizer, such that it can reduce the cost, and there will be no pipeline leakage that affects the air tightness.

Although the present disclosure has been disclosed above with embodiments, it is not intended to limit the present disclosure. Any person having ordinary skill in the art can make various changes and modifications without departing from the spirit and scope of the present disclosure. Therefore, the protection scope of the present disclosure should be defined by the scope of the appended claims.

What is claimed is:

1. A semiconductor high pressure annealing device, comprising:
- a chamber body comprising:
  - a lower opening; and
  - an assembly groove located on an inner side surface of the chamber body, and comprising an inner top surface facing the lower opening;
- a cover configured to close the lower opening;
- a lifting mechanism configured to drive the cover to move axially; and
- a floating sealing structure disposed on the chamber body and located in the assembly groove, and configured to seal the cover and the chamber body and to enhance air tightness between the chamber body and the cover, wherein the floating sealing structure comprises:
  - a body located in the assembly groove;
  - a plurality of fixing members disposed in the chamber body and connected to the body, and configured to dispose the body on the chamber body in a floating manner;
  - a first sealing ring located on an upper portion of the body and being not exposed on an inner side surface of the body, wherein the first sealing ring abuts against the inner top surface to enhance the air tightness between the body and the chamber body;
  - a second sealing ring located on a lower portion of the body and being not exposed on the inner side surface of the body, wherein the second sealing ring abuts against the body and the cover, and is configured to increase air tightness between the body and the cover; and
  - a preload spring assembly disposed on the upper portion of the body and abutting against the inner top surface, wherein the preload spring assembly acts in a longitudinal direction.

2. The semiconductor high pressure annealing device of claim 1, wherein the chamber body comprises:
- at least one through port configured to inject and/or discharge a protective gas; and
- at least one reactive gas injection and discharge port configured to inject and/or discharge a reactive gas.

3. The semiconductor high pressure annealing device of claim 2, wherein the floating sealing structure is located between the at least one through port and the at least one reactive gas injection and discharge port.

4. The semiconductor high pressure annealing device of claim 1, wherein the chamber body comprises:
- at least one through port; and
- at least one reactive gas injection and discharge port configured to inject and/or discharge a reactive gas,
- wherein the at least one through port is configured to accommodate at least one detection device, and the at least one detection device is configured to detect leaking of the reactive gas and whether external gases flow into the chamber body or not.

5. The semiconductor high pressure annealing device of claim 1, wherein the chamber body is configured to bear a pressure ranging from 10 bar to 1000 bar.

6. The semiconductor high pressure annealing device of claim 1, wherein
- the chamber body comprises a plurality of fastening recesses located on the inner side surface of the chamber body; and
- the cover comprises:
  - a plurality of fastening protrusions located on a bottom surface of the cover; and
  - a plurality of segment driving members respectively connected to the fastening protrusions, and configured to drive the fastening protrusions to insert into the fastening recesses or disengage from the fastening recesses.

7. The semiconductor high pressure annealing device of claim 1, wherein the lifting mechanism comprises a screw and a lifting driving member, and the lifting driving member is connected to the screw and is configured to drive the screw to rotate so as to drive the cover to move upward and downward.

8. The semiconductor high pressure annealing device of claim 1, wherein the body comprises:
- a first accommodating groove located on the upper portion of the body and configured to accommodate the first sealing ring;
- a second accommodating groove located on the lower portion of the body and configured to accommodate the second sealing ring; and
- an assembly portion located on the upper portion of the body and configured to accommodate the preload spring assembly.

9. The semiconductor high pressure annealing device of claim 8, wherein the second sealing ring comprises a fixing protrusion, and the fixing protrusion is configured to fix the second sealing ring in the second accommodating groove.

10. The semiconductor high pressure annealing device of claim 1, wherein the body comprises a plurality of assembly openings located on an outer side surface of the body, the fixing members are inserted into the assembly openings, and wherein a diameter of each of the fixing members is smaller than a diameter of a corresponding one of the assembly openings.

11. The semiconductor high pressure annealing device of claim 1, wherein a longitudinal cross-sectional shape of the first sealing ring is circular, U-shaped, X-shaped, W-shaped, quadrilateral, or wavy-shaped, and a longitudinal cross-sectional shape of the second sealing ring is circular, U-shaped, X-shaped, W-shaped, quadrilateral, or wavy-shaped.

12. The semiconductor high pressure annealing device of claim 1, wherein the preload spring assembly comprises a plurality of springs.

13. The semiconductor high pressure annealing device of claim 1, further comprising a cooling jacket, wherein the cooling jacket is disposed on an outer side surface of the chamber body and is configured to cool the chamber body and the first sealing ring.

14. The semiconductor high pressure annealing device of claim 1, further comprising a heater, and the heater being located within the chamber body.

15. A semiconductor high pressure annealing device, comprising:

- a chamber body comprising:
  - a lower opening; and
  - an assembly groove located on an inner side surface of the chamber body, and comprising an inner top surface facing the lower opening;
- a cover configured to close the lower opening;
- an air tight ring disposed on the cover, wherein when the cover closes the lower opening, the air tight ring is located between the chamber body and the cover;
- a lifting mechanism configured to drive the cover to move axially; and
- a floating sealing structure disposed on the chamber body and located in the assembly groove, and configured to seal the cover and the chamber body and to enhance air tightness between the chamber body and the cover, wherein the floating sealing structure comprises:
  - a body located in the assembly groove;
  - a plurality of fixing members disposed in the chamber body and connected to the body, and configured to dispose the body on the chamber body in a floating manner;
  - a first sealing ring located on an upper portion of the body and being not exposed on an inner side surface of the body, wherein the first sealing ring abuts against the inner top surface to enhance the air tightness between the body and the chamber body;
  - a second sealing ring located on a lower portion of the body and being not exposed on the inner side surface of the body, wherein the second sealing ring abuts against the body and the cover, and is configured to increase air tightness between the body and the cover; and
  - a preload spring assembly disposed on the upper portion of the body and abutting against the inner top surface, wherein the preload spring assembly acts in a longitudinal direction.

* * * * *